US009025339B2

(12) United States Patent
Luan et al.

(10) Patent No.: US 9,025,339 B2
(45) Date of Patent: May 5, 2015

(54) ADHESIVE DAM

(75) Inventors: Jing-En Luan, Singapore (SG); Hk Looi, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 523 days.

(21) Appl. No.: 13/340,345

(22) Filed: Dec. 29, 2011

(65) Prior Publication Data

US 2013/0170164 A1 Jul. 4, 2013

(51) Int. Cl.

| | |
|---|---|
| ***H05K 7/06*** | (2006.01) |
| ***H05K 3/30*** | (2006.01) |
| ***H05K 3/32*** | (2006.01) |
| ***H05K 3/34*** | (2006.01) |

(52) U.S. Cl.

CPC ............. *H05K 3/305* (2013.01); *Y10T 29/4913* (2015.01); *H05K 3/321* (2013.01); *H05K 3/3421* (2013.01); *H05K 2201/09781* (2013.01); *H05K 2201/09909* (2013.01)

(58) Field of Classification Search

CPC ........... H01L 2924/01079; H01L 2924/01078; H01L 2924/01029; H01L 2924/15311; H01L 2224/16; H01L 2924/14; H01L 21/56; H01L 2224/48091; H01L 2224/48227; H01L 2924/01014; H01L 2924/15312; H01L 2924/19043; H01L 2924/19041; H01L 25/0657; H01L 24/81; H05K 1/111; H05K 1/112; H05K 1/115; H05K 3/429; H05K 3/4602; H05K 2201/096; H05K 1/144; H05K 1/141; H05K 1/182; H05K 1/0306; H05K 7/142; H05K 7/023; H05K 7/02; H05K 7/12; H05K 7/06; H05K 7/1023; H05K 3/306; H05K 3/301; H05K 3/325; H05K 3/3421; H05K 3/305; H05K 3/321; H05K 2201/09781; H05K 2201/09909; H01R 23/68; H01R 23/685389; H01R 23/49827; H01R 24/58; G06F 1/184; G06F 1/185; H01H 63/06; G08B 7/06; B60R 16/0238; B60R 16/0239; G01D 15/00

USPC ......... 361/733, 739, 770, 760, 761, 771, 772, 361/807, 808, 822; 174/523, 260–262; 257/667

See application file for complete search history.

(56) References Cited

U.S. PATENT DOCUMENTS

| | | | | |
|---|---|---|---|---|
| 6,867,377 B2 * | 3/2005 | Anderson et al. | ............ | 174/254 |
| 7,224,070 B2 * | 5/2007 | Yang | ............ | 257/777 |
| 7,999,368 B2 * | 8/2011 | Yim et al. | ............ | 257/686 |
| 8,169,075 B2 * | 5/2012 | Takahashi et al. | ............ | 257/737 |
| 8,294,283 B2 * | 10/2012 | Ihara | ............ | 257/778 |
| 8,336,201 B2 * | 12/2012 | Choi et al. | ............ | 29/840 |
| 8,344,360 B2 * | 1/2013 | Auch et al. | ............ | 257/40 |
| 2003/0173655 A1 * | 9/2003 | Rissing et al. | ............ | 257/667 |
| 2009/0294162 A1 * | 12/2009 | Jeong et al. | ............ | 174/260 |
| 2011/0260338 A1 * | 10/2011 | Lee et al. | ............ | 257/778 |

* cited by examiner

*Primary Examiner* — Lisa Lea Edmonds
*Assistant Examiner* — Christopher L Augustin
(74) *Attorney, Agent, or Firm* — Seed IP Law Group PLLC

(57) ABSTRACT

On a circuit substrate on which an adhesive is used to couple electronic or structural components to the substrate, an adhesive dam is positioned to prevent the adhesive from interfering with the operation of the circuit. A contact pad can be provided at a selected location and with a selected shape, and solder deposited on the pad, then reflowed to form the dam. The dam can be a structure soldered to a contact pad, or the dam can be supported at its ends by another structure of the device, so that, at the location where it functions to contain the adhesive, it is not attached to the substrate.

18 Claims, 5 Drawing Sheets

160
140
164
146
150
144
148
162
152
142
134
136
166
138
168

ADHESIVE DAM

BACKGROUND

1. Technical Field

Embodiments of the present disclosure are related to circuit assembly, and in particular to the use of conductive and nonconductive adhesive to attach components to a circuit board.

2. Description of the Related Art

Typically, components are attached to circuit boards via solder. However, there are circumstances under which solder is not appropriate, and it becomes necessary to employ alternate means. In many cases, adhesives provide certain advantages for use in mounting components, as explained below with reference to FIG. 1.

FIG. 1 is a perspective view of a camera module 100 mounted to a circuit board 102, such as might be used in a cell phone, or other small camera, according to known art. The camera module 100 includes a housing 104, an image sensor chip 106 mounted to a chip carrier 108, a lens 110, and an autofocus module 112. The chip carrier 108 is mounted to the circuit board 102 by a ball grid array comprising a large plurality of solder connections between the chip carrier and corresponding contact pads of the circuit board. Although not shown in detail, the chip carrier 108, the autofocus module 112, and the housing 104 typically nest tightly together, in order to ensure that the lens 110 and the image sensor chip 106 are correctly positioned with respect to each other.

During the assembly process, the chip carrier is positioned on the circuit board 102 and the solder balls of the ball grid array are melted to reflow and form the solder connections. The housing 104 and the autofocus module 112 are then positioned over the chip carrier 108 and image sensor chip 106. The autofocus module 112 includes a voice-coil motor for moving the lens, and is provided with electric leads 114 for power and control. The electric leads 114 must be coupled to corresponding contact pads 116 of the circuit board 102. However, if solder is employed, there is the danger that some of the solder connections of the chip carrier 108 could be damaged by the heat of the additional solder process. Thus, a conductive adhesive 118 is employed to couple the electric leads 114 to the contact pads 116. At the same time, a nonconductive adhesive 120 is used to attach the housing to the circuit board 102.

In addition to permitting the formation of electrical connections without the degree of heat that would be required for solder joints, adhesive attachments can be formulated to be less brittle than solder. Thus, where some amount of flexion of the circuit board may occur, or repeated stress on a particular component, an adhesive connection may be preferable to a solder connection, because it will be less prone to breaking under such circumstances. Nonconductive adhesive can be used to attach component housings and other structural elements, and can be used over conductive traces or connections without affecting the operation of the circuit.

Most conductive adhesives are a composite of thermosetting epoxy resin and conductive metal particles. The most common metals used are silver, nickel, gold, copper, and indium or tin oxides. Relatively soft metals are preferred because they provide better contact between particles by deforming against each other when the adhesive shrinks during cure. Electricity is transmitted through the adhesive along paths of particles in contact with each other.

In selecting an adhesive, it is important that the particular adhesive is capable of wetting both the surface of the circuit board and the material of the component to be attached, in order to form a strong joint.

BRIEF SUMMARY

A device made according to various embodiments herein includes a circuit substrate and a first component coupled to the circuit substrate by an adhesive. An adhesive dam is positioned sufficiently close to the first component that a portion of the adhesive that couples the first component to the circuit substrate is in direct physical contact with the adhesive dam, but the adhesive does not extend on the circuit substrate to a side of the adhesive dam opposite the first component. The adhesive is prevented from making unintended and perhaps damaging contact with other elements of the circuit by the adhesive dam.

The adhesive dam may be formed of solder that is coupled to a contact pad of the circuit substrate without acting as a direct mechanical or electrical coupling between any component and the circuit substrate. The contact pad may be a dummy contact pad serving no electrical function in the device. The adhesive dam may be a structure mechanically coupled to a contact pad of the circuit substrate by a solder joint. The adhesive dam may serve no other function in the device except as a barrier to prevent adhesive from moving beyond the position of the adhesive dam prior to curing. Alternatively, the adhesive dam may be configured to conduct electricity from adhesive in contact therewith to the contact pad.

The first component may be an electrical connector that makes contact with a circuit of the circuit substrate only through the contact pad to which the adhesive dam is coupled. The adhesive dam may include convolutions on a face in contact with the adhesive. The adhesive dam may be a floating dam where the adhesive is located, and may be coupled to the circuit substrate at a location that is separate from the adhesive. The adhesive dam may be an integral part of a larger structure coupled to the circuit substrate. The adhesive dam may be coupled to the circuit substrate at an end of the adhesive dam, with no direct coupling to the circuit substrate along a portion of its length. The component may be a first component coupled to the circuit substrate by a first adhesive, the device may further include a second component coupled to the circuit substrate by a second adhesive, with the adhesive dam positioned sufficiently close to the first and second components that a portion of each of the first and second adhesives is in direct physical contact with the adhesive dam, without extending on the circuit substrate to a side of the adhesive dam opposite the first and second components, respectively.

The adhesive dam may be a solder bead formed on an elongate contact pad. The adhesive dam may include a structure coupled to the circuit substrate at a location corresponding to a position of the adhesive joint. The structure of the adhesive dam may be coupled to a contact pad of the circuit substrate by a solder joint. The adhesive dam may include a structure coupled to the circuit substrate at a location remote from a position of the adhesive joint.

A method may be summarized as including positioning a first component on a circuit board, an electrical connector of the first component positioned over a first contact pad of the circuit board; coupling the electrical connector to the first contact pad by reflowing solder and forming a solder joint on the first contact pad; positioning an adhesive dam on the circuit board; dispensing adhesive on the circuit board adjacent to the adhesive dam; positioning a second component in contact with the adhesive; and coupling the second component to the circuit board by curing the adhesive, with a portion of the adhesive in contact with the adhesive dam.

The positioning an adhesive dam on the circuit board may include placing solder paste on a second contact pad of the circuit board and reflowing the solder paste during the coupling the electrical connector to the first contact pad by reflowing solder. The positioning an adhesive dam on the circuit board may include forming a barrier of solder, which includes the placing solder paste and the reflowing the solder paste. The positioning an adhesive dam on the circuit board may include, after the placing solder paste, and before the reflowing the solder paste, positioning a barrier structure in contact with the solder paste. The positioning an adhesive dam on the circuit board may include coupling the adhesive dam to the circuit board at a location remote from the adhesive.

DETAILED DESCRIPTION

In selecting an appropriate adhesive for any given application, a number of factors must be considered, including the mechanical strength of the adhesive, the wettability of the material of the parts to be joined, the environment in which the adhesive must function, and the anticipated stress that must be withstood—both in terms of magnitude and vector, relative to the joint. For any given combination of these elements, there will be a minimum volume of adhesive required, and a minimum surface area of contact of the adhesive with each of the parts. If both parts to be joined are highly wettable by an adhesive that has a high mechanical strength, relative to the anticipated stress, and under the anticipated environmental conditions, then the amount of adhesive necessary to make a satisfactory joint may be relatively small. However, as any of the critical factors moves away from a preferred value, the volume and surface area required will generally increase. For example, if the adhesive joint will be subjected to temperatures at which the mechanical strength of the adhesive is reduced, a larger volume of adhesive may be required to meet the strength requirements at those temperatures. Likewise, if one of the parts is only partially wettable by the adhesive, contact by the adhesive over a larger surface area of that part may be required for the adhesive to hold with sufficient strength.

As noted in the background, conductive adhesives for use in circuit assembly are typically made so by the addition of metallic particles to an epoxy resin adhesive. Particles in contact with each other within the adhesive form electrical paths through the adhesive. Thus, electrical (and thermal) conductivity is increased as the ratio of conductive material to adhesive is increased. However, if the ratio of conductive material increases, this means, of course, that the ratio of adhesive decreases. As the ratio of adhesive decreases, so too does the strength and adhesion of the adhesive, because there is less resin in contact with the surfaces to be joined, and because the resin is separated by the metallic particles into a thinner and weaker matrix. If too much conductive filler material is added, the mechanical strength of the adhesive is excessively reduced. On the other hand, if the ratio of conductive material is too low, the increased electrical resistance of the adhesive will affect the operation of the circuit.

Electrical resistance of an adhesive can often be reduced by providing a larger volume of adhesive and larger surface area of contact between the adhesive and the parts to be joined. This permits formulation of a stronger adhesive while providing adequate conductivity.

Figure 1:
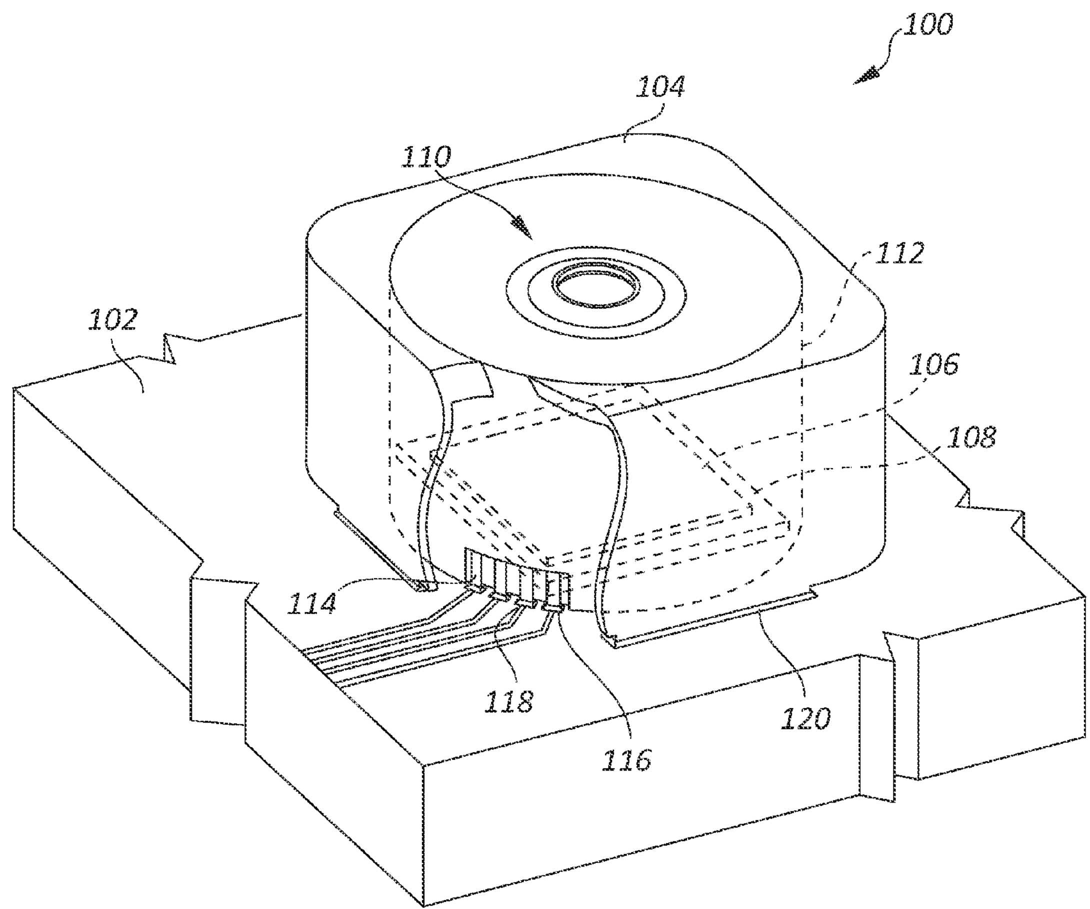
FIG. 1 is a perspective view of a camera module mounted to a circuit board, such as might be used in a cell phone or other small camera, according to known art.
Figure 2:
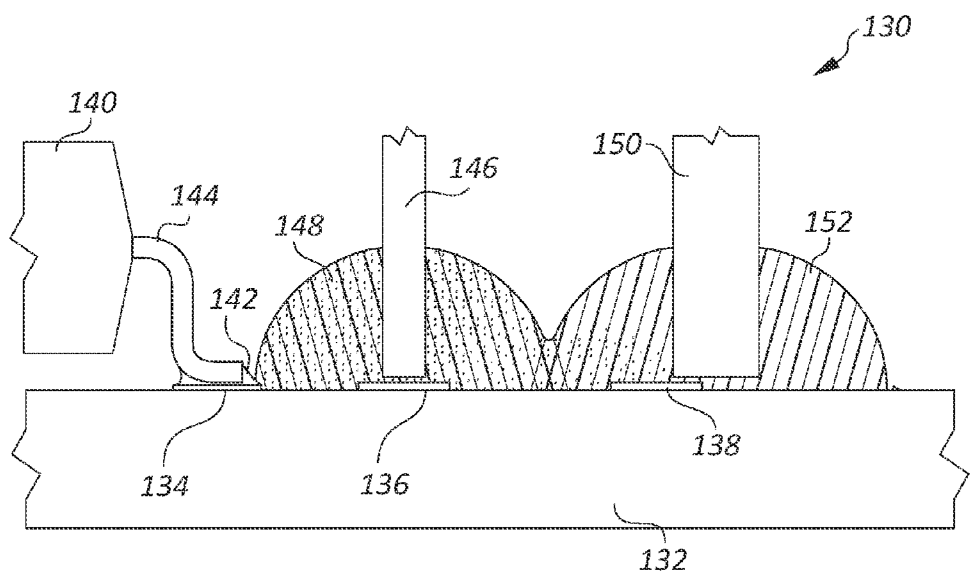
FIG. 2 is a sectional view of a small portion of an electronic circuit illustrating problems that the inventors have encountered.

As market pressures drive an ongoing reduction in the size of electronic devices, electronic components are positioned more closely together. FIG. 2 shows a hypothetical circuit that illustrates problems that the inventors have encountered, related to adhesives, that have arisen in some electronic devices. In FIG. 2, a portion of an electronic circuit 130 is shown in a sectional view. The circuit 130 includes a circuit board 132 with contact pads 134, 136, 138. A portion of a chip carrier package 140 is shown, with a solder joint 142 coupling a lead 144 of the chip carrier 140 to the contact pad 134. An electrical connector 146 is mechanically coupled to the circuit board 132 and electrically coupled to the contact pad 136 by conductive adhesive 148. A wall 150 of a housing is mechanically mounted to the circuit board 132 over the contact pad 138 by nonconductive adhesive 152. In the example shown in FIG. 2, the configuration of the circuit board 132 does not employ the contact pad 138, so one purpose of the nonconductive adhesive 152 is to insulate the circuit pad 138 and prevent unintentional electrical contact between it and other components.

During assembly, the chip carrier 140 is mounted first, using a reflow solder process. Adhesive dispensers then deposit the conductive adhesive 148 and the nonconductive adhesive 152, followed by placement of the electrical connector 146 and wall 150, using a pick-and-place system. The circuit is then subjected to a moderate heat to cure the conductive and nonconductive adhesives 148, 152.

In the example circuit 130 of FIG. 2, the adhesives 148 and 152 spread slightly when the respective components are placed, and again during the curing process. As a result, conductive adhesive 148 extends into contact with the contact pad 134 and solder joint 142, creating a short circuit between the contact pads 134 and 136. Additionally, the conductive adhesive 148 and nonconductive adhesive come into contact. During the curing process, the adhesives soften and liquefy to some degree before they harden, so that some portion of the metallic particles in the conductive adhesive have migrated to the nonconductive adhesive. This reduces the conductivity of the conductive adhesive, introducing undesirable resistance into the electrical connection between the electrical connector 146 and the contact pad 136. Additionally, sufficient particles have migrated to the nonconductive adhesive to permit a small electrical current to the contact pad 138, which degrades circuit operation and causes intermittent failures. Finally, the formulations of the epoxy resins of the adhesives 148 and 152 are not identical, but have been modified in order to adequately adhere to the materials of the electrical connector 146 and the wall 150, respectively. As a result, they are not chemically compatible, so that when they mix, the strength characteristics of one or both are reduced. This increases the possibility that under stress, a joint failure may occur.

The problems described with reference to the example circuit 130 are typical of the kinds of problems that occur because of the very tight spacing on many circuit boards. The inventors have found that, in many cases, if the volume of adhesive is reduced to a degree sufficient to prevent the kinds of unintended contact described above, there is not sufficient adhesive volume or surface area of contact, resulting in joint failure or excessive electrical resistance.

Figure 3:
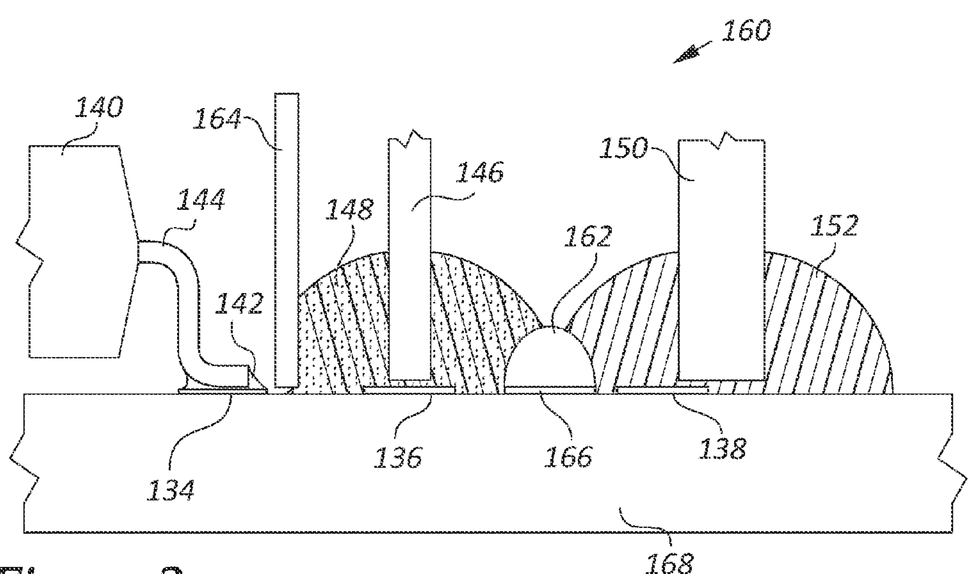
FIG. 3 is a sectional view of a portion of a circuit according to an embodiment.

FIG. 3 is a sectional view of a portion of a circuit 160 according to one embodiment of the invention. Circuit 160 is similar in most respects to the circuit 130 of FIG. 2, but includes adhesive dams 162, 164, and also an additional contact pad 166 positioned on the surface of the circuit board 168. The contact pad 166 is formed on the surface of the circuit board 168 during the same process used to form contact pads 134, 136, and 138. In the embodiment of FIG. 3, the contact pad 166 is not part of the electrical circuit 160, but is instead a dummy pad, electrically isolated from other components and conductors of the circuit. In other embodiments, the contact pad 166 is not a dummy pad, but is integrated into the circuit, as will be discussed in more detail later with reference to other embodiments.

Prior to connecting components to the circuit board 168, a printing process is used to deposit solder paste on contact pads to which components are to be soldered, including the contact pad 134. At the same time, a quantity of solder is deposited on the contact pad 166. Following placement of the appropriate components, heat is applied to melt and reflow the solder paste. This forms the solder joints that connect components such as the chip carrier package 140 to the circuit board 168. The solder that is deposited on the contact pad 166 does not serve to attach any component, but instead forms a smooth bump or ridge on the pad, and when the solder cools and hardens, forms an adhesive dam 162. Surface tension of the solder, while in a molten state, pulls the solder into its most efficient shape, i.e., the shape with the smallest surface area, which will generally resemble a portion of a sphere or cylinder, depending on the shape of the contact pad 166 and the volume of solder. Thus, the height of the dam 162 can be controlled by selection of the shape of the contact pad 166 and the amount of solder used to form the dam.

Following the formation of the solder dam 162, the process proceeds as described above: adhesive is deposited, components that are to be attached are positioned, and the adhesive is cured. The size, shape, and position of the adhesive dam 162 are selected to act as a barrier to prevent adhesive on one or both sides of the dam from coming into contact with elements on the respective opposite side of the dam. In the case of the circuit 160 of FIG. 3, the conductive adhesive 148 is prevented from contacting or mixing with the nonconductive adhesive 152.

The adhesive dam 164 is attached to an element that is elsewhere coupled to the circuit board, so that no attachment is necessary at the location where it functions to prevent unwanted movement of the conductive adhesive 148. The adhesive dam 164 can be referred to as a floating dam, because it is not directly attached to the circuit board 168. Thus, the adhesive dam 164 can be used in locations where the spacing is too close for an adhesive dam that is coupled to a contact pad, like the dam 162. The dam 164 can be positioned in direct contact with the circuit board 168, or can be positioned with a small space beneath, as shown in FIG. 3. Generally, adhesives used in such applications have a relatively high viscosity, so they will not flow a significant distance underneath the dam 164. In any event, the spacing of the dam 164 from the circuit board 168 can be selected according to the viscosity of adhesive to be used, to prevent substantial movement of the adhesive under the dam.

The adhesive dam 164 can be made from any appropriate material. If it is positioned in contact with an element such as, for example, the solder connection 142 of the chip carrier package 140, or if the dam 164 is to be in contact with the conductive adhesive of more than one electrical connector 146, the dam should be of a nonconductive material, to prevent forming a short circuit. Generally, a floating dam is formed as part of another structure mounted to the circuit board. However, a floating dam can be a separate structure attached at one or both ends to the circuit board but unattached along a length that is in contact with adhesive.

Figure 4:
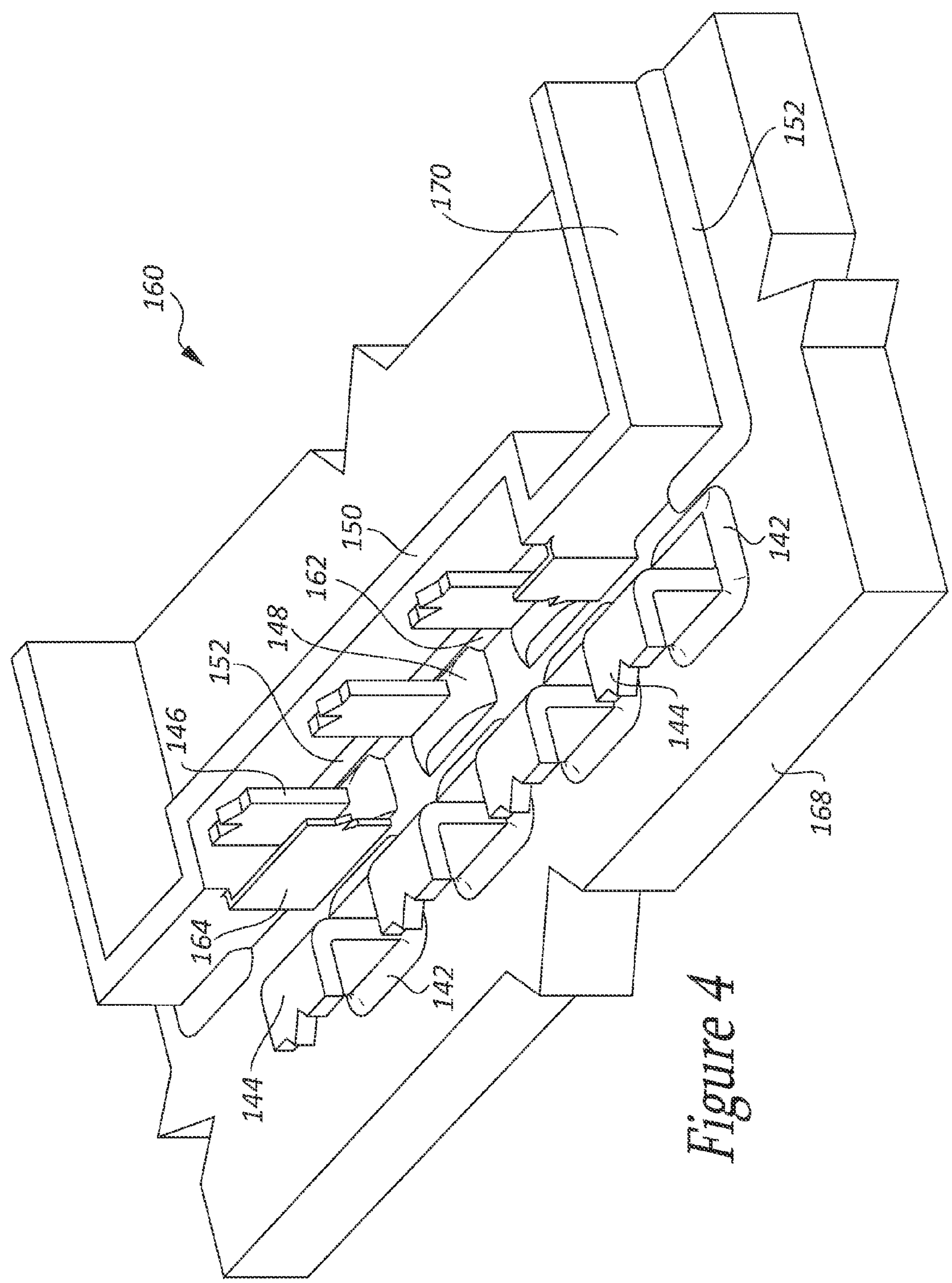
FIG. 4 is a perspective view of the circuit of FIG. 3.

Turning to FIG. 4, a perspective view of the circuit of FIG. 3 is shown. In this view it can be seen that the wall 150 is part of a housing 170 that is attached to the circuit board 168 by nonconductive adhesive 152. The floating adhesive dam 164—a portion of which is cut away in the figure to show additional detail—is an integral part of the housing 170. In this embodiment, the housing 170 is formed of a precast resin, and is provided to support a component that is electrically coupled to the circuit 160 via the connectors 146. The height of the adhesive dam 164 is selected to permit the nozzle of an adhesive dispenser to deposit the conductive adhesive 148 on the circuit board between the floating dam 164 and the wall 150.

During assembly of the circuit 160, the nonconductive adhesive 152 is deposited, followed by the positioning of the housing 170. The conductive adhesive is then deposited, and the electrical connectors are positioned in the space provided. The whole is then heated to cure the adhesives.

According to an alternative embodiment, the housing 170 is attached and the nonconductive adhesive cured prior to deposition of the conductive adhesive. According to another alternate embodiment, the housing 170 is attached by other means, such as, e.g., mechanical fasteners, or a snap-in engagement with apertures formed in the circuit board 168.

According to an embodiment, a floating dam is provided that is attached to a supporting structure at one end only, and is thus cantilevered across a position where it functions as an adhesive dam.

Figure 5A:
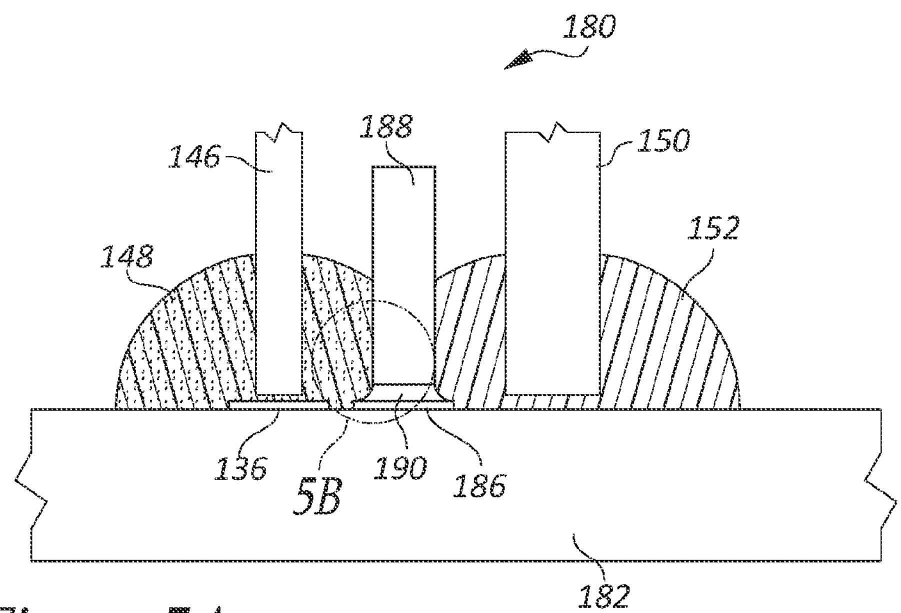
FIG. 5A is a sectional view of a portion of an electronic circuit according to another embodiment.

FIG. 5A is a sectional view of a portion of an electronic circuit 180, according to another embodiment. The circuit 180 includes a circuit board 182 on which first and second contact pads 184, 186 are positioned. An electrical connector 146 and a wall 150 are coupled to the circuit board 182 by conductive adhesive 148 and nonconductive adhesive 152, respectively. Additionally, an adhesive dam 188 is coupled to the circuit board 182 by a solder joint 190. The adhesive dam 188 extends between the connector 146 and the wall 150 along their common length. In other words, the adhesive dam 188 extends at least a length sufficient to prevent the conductive adhesive 148 of the electrical connector 146 from intermixing with the nonconductive adhesive 152 of the wall 150.

The adhesive dam 188 is positioned and attached during the same process by which other components are positioned and soldered to the circuit board 182, such as, e.g., chip carrier packages like the package 140 described with reference to FIGS. 2 and 3. Thus, according to an embodiment, the dam 188 is made from a material that is readily wetted by molten solder.

Figure 5B:
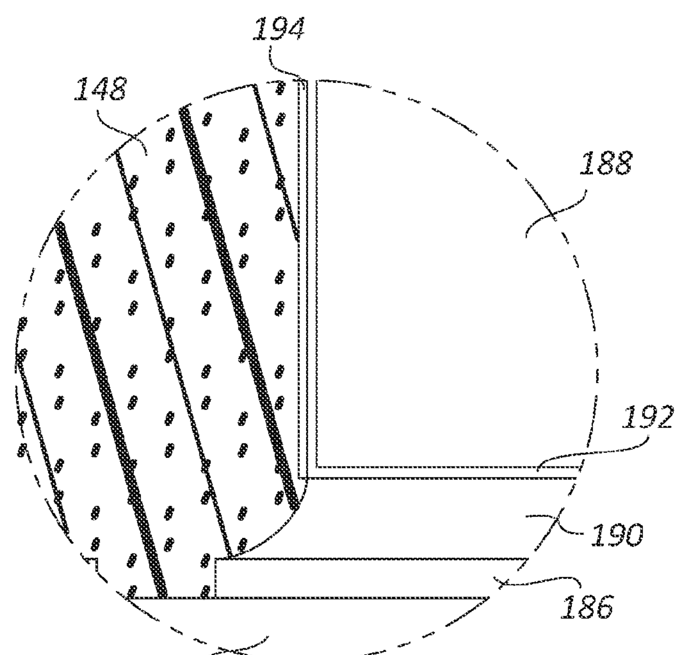
FIG. 5B shows a further enlarged detail of the portion of the circuit of FIG. 5A, as indicated at 5B.

FIG. 5B shows a further enlarged detail of a portion of the circuit 180, as indicated at 5B in FIG. 5A. In particular, a portion of the adhesive dam 188 is shown, with the solder joint 190 coupling the dam to the contact pad 186 of the circuit board 182. According to the embodiment of FIG. 5B, the adhesive dam 188 is plated with a first layer 192 of material that is readily wettable by the solder 190, such as, e.g., silver or tin. Thus, the material of adhesive dam 188 can be selected according to criteria other than its solderability, then plated so as to be solderable. Such criteria can include, for example, price, availability, structural strength, workability, etc.

The adhesive dam 188 is also plated with a second layer 194 of material that is readily wettable by the conductive adhesive 148, with the first layer 192 exposed at the bottom of the dam where it is contacted by the solder joint 190. The second layer 194 permits the adhesive 148 to form a strong mechanical joint between the electrical connector and the dam 188, significantly increasing the mechanical coupling of the electrical connector 146 to the circuit board 182. According to an embodiment, the contact pad 186 is placed in electrical contact with the contact pad 136, and the second layer 194 is also selected to be electrically conductive. Thus, the electrical coupling between the electrical connector 146 and the contact pad 136 is also significantly improved by the connection between the conductive adhesive 148 and the adhesive dam 188.

According to embodiments in which the conductive and nonconductive adhesives 148, 152 have different wettability requirements, the second layer can be plated on one face of the adhesive dam 188, while a third layer is plated on the face opposite, selected to be wetted by the nonconductive adhesive 152. Alternatively, the first layer 192 or the bare material of the dam 188 can be exposed on one or both vertical faces of the dam, according to the materials used and the wetting requirements of the adhesives.

As used herein, the term plate can be read broadly to refer to any process or processes employed to apply a layer of material onto one or more faces of an adhesive dam, including electroplating, spraying, electrostatic powder deposition, application by roller or brush, etc. Such processes can also include masking and abrasive removal steps to produce a dam with different materials exposed on respective different faces.

According to an embodiment, the adhesive dam 188 is part of an extrusion that is plated as necessary, then cut into lengths for use on respective copies of the circuit 180. In this way, the handling costs for preparing the dam 188 are distributed among all of the dams cut from a given parent piece.

Figure 6:
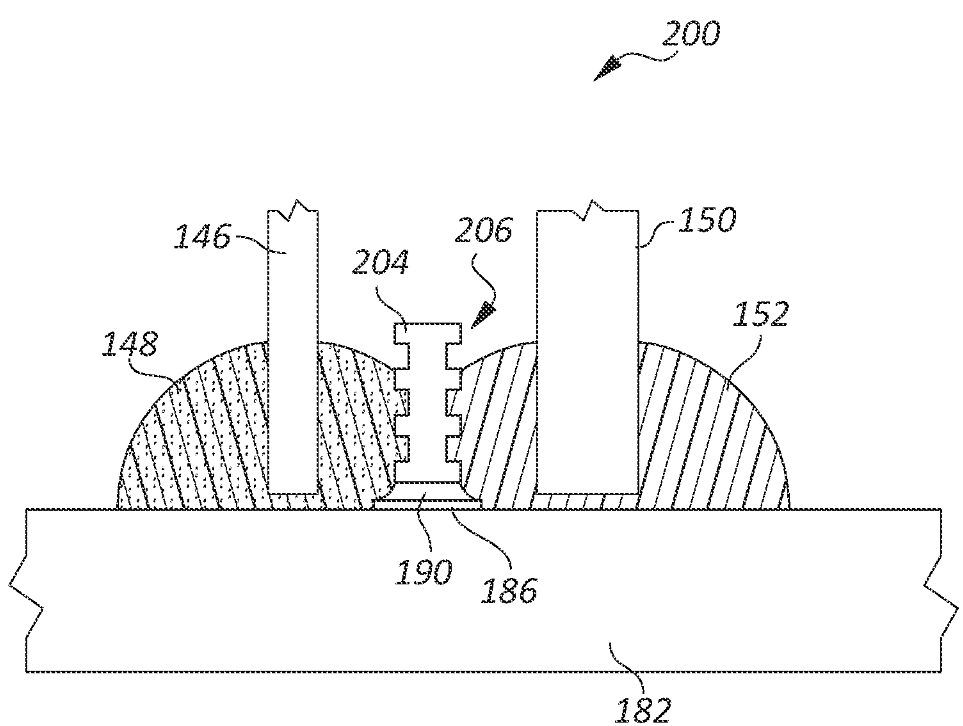
FIG. 6 is a sectional view of a portion of a circuit according to a further embodiment.

FIG. 6 is a sectional view of a circuit 200 according to an embodiment. The circuit 200 is similar in most respects to the circuit 180 of FIGS. 5A and 5B. The circuit 200 differs in that the adhesive dam has convolutions 206, as shown, and the contact pad 136 is absent. In the embodiment of FIG. 6, the contact pad 186 is coupled into the circuit 200 in place of the contact pad 136 from the circuit of FIG. 3, and provides the electrical connection between the electrical connector 146 and the circuit, via the conductive adhesive 148. This arrangement is beneficial in cases where there is not sufficient space on the surface of the circuit board 202 for the contact pad 136 and contact pad 186. It is only necessary to ensure that there is sufficient volume of adhesive between the connector 146 and the adhesive dam 204 to ensure a low-resistance electrical coupling.

The convolutions 206 are shown in FIG. 6 as simple ridges and grooves on the sides of the dam 204. These provide increased surface area for contact with the adhesives to increase mechanical or electrical coupling on that basis. Additionally, the shape of the convolutions 206 can be selected to permit the adhesives 148, 152 to mechanically lock to the dam 204, so that, even if the wetting of the dam by the adhesives is minimal, a mechanical coupling can be achieved that will resist separation. The convolutions 204 can, for example, be undercut so that the adhesives, when cured, form a dovetail-like joint with the dam.

The embodiments disclosed above are provided to show various kinds of adhesive dams according to respective embodiments, and some of the benefits provided. There is no requirement that they be used exactly as shown, or that, for example, conductive and nonconductive adhesives are both present. Adhesive dams, according to various embodiments, can be used anywhere adhesives are used on a circuit substrate, particularly in locations where the adhesive can potentially extend to unintended locations. The adhesive dams therefore advance the functions of the adhesives by enabling the use of sufficient volumes of adhesive to meet the selected requirements without interfering with operation of the circuit.

In describing the embodiments illustrated in the drawings, directional references, such as right, left, top, bottom, vertical, horizontal, etc., are used to refer to elements or movements as they are shown in the figures. Such terms are used to simplify the description and are not to be construed as limiting the claims in any way.

Ordinal numbers, e.g., first, second, third, etc., are used according to conventional claim practice, i.e., for the purpose of clearly distinguishing between claimed elements or features thereof. The use of such numbers does not suggest any other relationship, e.g., order of operation or relative position of such elements, nor does it exclude the possible combination of the listed elements into a single, multiple-function, structure or housing. Furthermore, ordinal numbers used in the claims have no specific correspondence to those used in the specification to refer to elements of disclosed embodiments on which those claims read.

The term component is used in the specification and claims to refer to structural or electronic elements that are coupled to a circuit substrate.

Contact pads are typically thin copper or a copper alloy plates on the surface of a circuit board, having, in plan view, a regular shape with a low aspect ratio, e.g., round or square. Contact pads are provided on the surface of a circuit board to provide connection points to which electrical connectors of components can be coupled. In the present specification and claims, the term contact pad can be read more broadly, in the sense that the term is not limited to a regular shape with a low aspect ratio, but can have any shape. Thus, a long, narrow contact pad can be provided for the formation or attachment of an adhesive dam, as described above.

The term couple includes within its scope indirect coupling, such as when two elements are coupled with one or more intervening elements. Thus, for example, the chip carrier package 140 of FIGS. 2 and 3 is coupled to the contact pad 134 by the solder joint 142, via the intervening lead 144. The term direct coupling refers to a configuration in which there is no intervening element between the coupled elements.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:

a circuit substrate;

a first component positioned on the circuit substrate, coupled to the circuit substrate by an adhesive;

a second component positioned adjacent to the first component and on the circuit substrate;

a third component positioned adjacent to the first component and on the circuit substrate;

a contact pad on the circuit substrate between the first and second components;

a first adhesive dam of electrically conductive solder positioned on the contact pad between the first and second components, sufficiently close to the first component that a portion of the adhesive that couples the first component to the circuit substrate is in direct physical contact with the adhesive dam, and does not extend on the circuit substrate to a side of the adhesive dam opposite the first component; and a second adhesive dam positioned between the first component and the third circuit component, the second adhesive dam being coupled to the circuit substrate by the adhesive, and a space between the second adhesive dam and the circuit substrate being selected based on the viscosity of the adhesive.

2. The device of claim 1, wherein the first adhesive dam is not a direct mechanical or electrical coupling between any component and the circuit substrate.

3. The device of claim 1, wherein the contact pad is a dummy contact pad serving no electrical function in the device.

4. The device of claim 1 wherein the first adhesive dam is a structure mechanically coupled to a contact pad of the circuit substrate by a solder joint.

5. The device of claim 4 wherein the first adhesive dam does not serve any function in the device except as a barrier to prevent adhesive from moving beyond the position of the adhesive dam prior to curing.

6. The device of claim 4 wherein the first adhesive dam serves no function except to advance a function served by adhesive in contact therewith.

7. The device of claim 4 wherein the first adhesive dam is configured to conduct electricity from adhesive in contact therewith to the contact pad.

8. The device of claim 7 wherein the first component is an electrical connector that makes contact with a circuit of the circuit substrate only through the contact pad to which the first adhesive dam is coupled.

9. The device of claim 4 wherein the first adhesive dam includes convolutions on a face in contact with the adhesive.

10. The device of claim 1 wherein the first adhesive dam is an integral part of a larger structure coupled to the circuit substrate.

11. The device of claim 1, wherein the adhesive is a conductive adhesive.

12. The device of claim 1, wherein the adhesive is a first adhesive, the second component being coupled to the circuit substrate by a second adhesive, and wherein the first adhesive dam is positioned sufficiently close to the first and second components that a portion of each of the first and second adhesives is in direct physical contact with the first adhesive dam, and does not extend on the circuit substrate to a side of the first adhesive dam opposite the first and second components, respectively.

13. A device comprising:

a circuit substrate;

first and second circuit components positioned on the circuit substrate;

a contact pad over the circuit substrate;

an adhesive joint mechanically coupling the first circuit component to the circuit substrate;

a first adhesive dam of electrically conductive solder positioned on the contact pad adjacent to the adhesive joint and having a first side facing the first circuit component and a second side facing away from the first circuit component, material of the adhesive joint making direct contact with the first side of the adhesive dam but not with the second side of the adhesive dam; and a second adhesive dam positioned between the first component and the second circuit component, the second adhesive dam being coupled to the circuit substrate by the adhesive joint, and a space between the second adhesive dam and the circuit substrate being selected based on the viscosity of the adhesive material that forms the adhesive joint.

14. The device of claim 13 wherein the first adhesive dam comprises a structure coupled to the circuit substrate at a location corresponding to a position of the adhesive joint.

15. The device of claim 14 wherein the structure of the first adhesive dam is coupled to a contact pad of the circuit substrate by a solder joint.

16. The device of claim 13 wherein the first adhesive dam comprises a structure coupled to the circuit substrate at a location remote from a position of the adhesive joint.

17. The device of claim 12, wherein the first adhesive is a conductive adhesive, and the second adhesive is a nonconductive adhesive.

18. The device of claim 13, wherein the adhesive that forms the adhesive joint is a conductive adhesive.

* * * * *